(12) United States Patent
Savin

(10) Patent No.: US 11,469,775 B2
(45) Date of Patent: Oct. 11, 2022

(54) METHOD FOR DECODING INERTIA-EFFECT BIT-FLIP LDPC CODES

(71) Applicant: COMMISSARIAT A L'ENERGIE ATOMIQUE ET AUX ENERGIES ALTERNATIVES, Paris (FR)

(72) Inventor: Valentin Savin, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/191,882

(22) Filed: Mar. 4, 2021

(65) Prior Publication Data

US 2021/0288666 A1    Sep. 16, 2021

(30) Foreign Application Priority Data

Mar. 11, 2020 (FR) ...................... 20 02431

(51) Int. Cl.
*H03M 13/00* (2006.01)
*H03M 13/11* (2006.01)
(52) U.S. Cl.
CPC .............................. *H03M 13/1108* (2013.01)
(58) Field of Classification Search
CPC ......... H03M 13/1108; H03M 13/1162; H03M 13/2948
See application file for complete search history.

(56) References Cited

U.S. PATENT DOCUMENTS

| 8,650,453 B2* | 2/2014 | Ng | H03M 13/114 |
| | | | 714/751 |
| 8,918,696 B2* | 12/2014 | Ng | H03M 13/114 |
| | | | 714/758 |
| 9,411,683 B2* | 8/2016 | Kwok | H03M 13/3715 |
| 10,177,787 B1* | 1/2019 | Danjean | H03M 13/618 |

(Continued)

OTHER PUBLICATIONS

French Preliminary Search Report dated Oct. 26, 2020 in French Application 02 02431 filed on Mar. 11, 2020 (with English Translation of Categories of Cited Documents), 4 pages.

(Continued)

*Primary Examiner* — Esaw T Abraham
(74) *Attorney, Agent, or Firm* — Oblon, McClelland, Maier & Neustadt, L.L.P.

(57) ABSTRACT

A method for decoding a Low Density Parity Check code. At each decoding iteration, as long as the syndrome of the estimated word indicates an error, a set ($\tilde{F}$) of the least reliable bits of the word is determined as those where the value of a local energy function ($\tilde{E}_n$) is less than a threshold value. The local energy value of a bit includes a first component proportional to the correlation between this bit and a sample corresponding to the observed signal, a second component representing the number of non-satisfied constraints wherein the bit acts, and a third component decreasing with the number ($\ell_n$) of iterations made since the last flipping of this bit. The bits of the estimated word belonging to this set are flipped, where applicable with a predetermined probability, to provide a new estimated word at the following iteration.

10 Claims, 4 Drawing Sheets

(56) References Cited

U.S. PATENT DOCUMENTS

| | | | | |
|---|---|---|---|---|
| 10,530,392 B2* | 1/2020 | Reynwar | ........... | H03M 13/6577 |
| 10,560,120 B2* | 2/2020 | Marchand | .......... | H03M 13/1117 |
| 10,651,872 B2* | 5/2020 | Savin | .................... | H04L 1/0057 |
| 10,879,930 B2* | 12/2020 | Ha | ..................... | H03M 13/1108 |
| 11,018,695 B1* | 5/2021 | Zhang | ................ | H03M 13/1108 |
| 11,050,519 B2* | 6/2021 | Hong | ................... | H04L 5/0055 |
| 11,159,175 B2* | 10/2021 | Vanaparthy | ............ | G11C 29/52 |

OTHER PUBLICATIONS

Cui et al., "An Improved Gradient Descent Bit-Flipping Decoder for LDPC Codes", IEEE Transactions on Circuits and Systems 1: Regular Papers, vol. 66, No. 8, Aug. 2019, pp. 3188-3200, XP011733877.

Zhang et al., "Tabu-List Noisy Gradient Descent Bit Flipping Decoding of LDPC Codes", 11th International Conference on Wireless Communications and Signal Processing (WCSP), IEEE, 2019, pp. 1-5, XP033671687.

Tithi et al., "Decoding LDPC codes via Noisy Gradient Descent Bit-Flipping with Re-Decoding", ARXIV.ORG, Cornell University Library, 2015, 5 pages, XP081333375.

Chang et al., "Multi-Stage Bit-Flipping Decoding Algorithms for LDPC Codes", IEEE Communications, vol. 23, No. 9, Sep. 2019, pp. 1524-1528, XP011745001.

Li et al., "A Modified Gradient Descent Bit Flipping Decoding Scheme for LDPC Codes", IEEE International Workshop on Signal Processing Systems (SIPS), 2017, pp. 1-6, XP033257020.

Sundararajan et al., "Noisy Gradient Descent Bit-Flipping Decoders approaching Maximum Likelihood Decoding", IEEE Transactions on Communications, vol. 62, No. 10, Oct. 2014, pp. 3385-3400, XP011561720.

Declercq et al., "Noise-Aided Gradient Descent Bit-Flipping Decoders approaching Maximum Likelihood Decoding" 2016 9th International Symposium on Turbo Codes & Iterative Information Processing, 2016, pp. 300-304, XP032981313.

Wadayama et al., "Gradient Descent Bit Flipping Algorithms for Decoding LDPC Codes", IEEE Transactions on Communications, vol. 58, No. 6, Jun. 2010, pp. 1610-1614, XP011310482.

Gallager, "Low-Density Parity-Check Codes", IRE Transactions on Information Theory, vol. IT-8, 1962, pp. 21-28.

Al Rasheed et al., "Fault-Tolerant Probabilistic Gradient-Descent Bit Flipping Decoder", IEEE Communications Letters, vol. 18, No. 9, 2014, pp. 1487-1490.

* cited by examiner

METHOD FOR DECODING INERTIA-EFFECT BIT-FLIP LDPC CODES

TECHNICAL FIELD

The present invention relates in general terms to LDPC (Low Density Parity Check) codes and more particularly decoding methods of the so-called GDBF (Gradient Descent Bit Flipping) type. It is in particular applicable to communication systems or data-recording systems using LDPC codes.

PRIOR ART

LDPC codes, initially introduced by R. Gallagher in his article entitled "Low density parity check codes" published in IEEE Trans. Inform. Theory, vol. IT-8, pages 21-28, 1962, are now used in a large number of communication standards such as G.hn/G.9960 (ITU-T standard for power-line, telephone-line and coaxial-cable communications), IEEE 802.3an (10 Giga-bit/s Ethernet on twisted pair), IEEE 802.16e (WiMAX standard for microwave communications), IEEE 802.11n-2009 (Wi-Fi standard), CMMB (China Multimedia Mobile Broadcasting), DVB-S2/DVB-T2/DVB-C2 (Digital Video Broadcasting, $2^{nd}$ generation), DMB-T/H (Digital video broadcasting), DOCSIS 3.1 (Data Over Cable Service Interface Specification), or 5G-NR (New Radio, $5^{th}$ generation).

A large number of methods for decoding LDPC codes are known from the prior art. A first iterative decoding method, known as bit flipping (BF), originally proposed by R. Gallagher by way of example, is particularly simple but does not make it possible to obtain good performance in terms of error rate as a function of the signal to noise ratio. It was quickly supplanted by an iterative decoding method known as message passing or MP, more recently renamed belief propagation (BP) decoding method. This method uses a representation of an LDPC code by means of a bipartite graph (Tanner graph), consisting of two separate subsets, a first subset of nodes being associated with the bits of the word to be decoded (referred to as variable nodes) and a second subset of nodes associated with the constraints of the code (referred to as control nodes), typically parity checks. The decoding is based on a sequence of iterations, each iteration involving exchanges of round-trip messages between the variable nodes and the control nodes of the graph. More precisely, a message transmitted by a variable node to a control node represents the "belief" of the variable node as to the value of the corresponding coded bits. Conversely, the message transmitted by a control node to a variable node represents the "belief" of the control node as to the value of the coded bit corresponding to the destination variable node. In practice, these messages are defined in terms of probabilities, or logarithmic likelihood ratios (LLRs).

The BP decoding method has given rise to numerous variants such as the "Sum-Product", "Min-Sum", "Min-Max" etc. decoding algorithms. These methods make it possible to obtain good performance in terms of error rate as a function of the signal to noise ratio but are generally intensive in terms of resources and computing time.

The emergence of communication requirements at very high bit rate and/or low latency has given rise to a regain in interest for bit-flip decoding methods. Recently, a BF decoding method that is particularly attractive because of the simplicity thereof was proposed in the article by T. Wadayama et al. entitled "Gradient descent bit flipping algorithms for decoding LDPC codes" published in IEEE Trans. on Comm., vol. 58 No. 6, June 2010, pp. 1610-1614. BF decoding is formulated here in the form of an optimisation problem and the code word, the solution to this problem, is obtained by means of a gradient descent algorithm. This decoding method, called GDBF (Gradient Descent Bit Flipping) makes it possible to obtain substantially better performance than the Gallagher BF decoding method but nevertheless suffers from a major drawback inherent in gradient descent algorithms when the cost function is highly non-linear, namely when the solution obtained is very often only a local minimum. In other words, the GDBF decoding method is suboptimum in that it can provide only a local minimum of the cost function (or a local maximum of the objective function). Thus, the performance thereof still remains inferior to decoding methods of the BP type.

Different variants of the GDBF methods have been proposed in order to remedy this problem of suboptimality, in particular the PGDBF (Probabilistic GDBF) method and the NGDBF (Noisy GDBF) method. These two methods are based on the principle that adding a random noise in the gradient descent makes it possible to depart from a local optimum. As we shall see later, random noise is added at the level of the decision rule for flipping the least reliable bits.

We shall present first of all the GDBF decoding method before presenting the PGDBF and NGDBF variants thereof.

We consider an LDPC code defined by its Tanner graph TG (or in an equivalent fashion by its parity matrix H, the edges of the graph corresponding to the non-zero elements of the matrix), said graph comprising N variable nodes and M control nodes (each control node corresponding to a parity equation or in an equivalent fashion to a row of the matrix H). Hereinafter the set of control nodes connected to the variable node n by an edge of the graph will be denoted H(n) and all the variable nodes connected to the control node m will be denoted H(m).

We shall suppose hereinafter that the symbols constituting a code word are binary and represented by +1,−1, the bit "0" being conventionally associated with the symbol +1 and the bit "1" with the symbol −1. For example, the transmission channel may be a binary symmetric channel or BSC, or a binary channel disturbed by an additive white Gaussian noise (AWGN).

A code word may be represented by a vector x of size N, the elements of which belong to $\{+1,-1\}$, satisfying the parity equations, that is to say $Hx=(+1, +1, \ldots, +1)^T$ with the aforementioned conventions. A code word x is obtained from an information word a by the equation x=aG where G is the generating matrix of the code satisfying the equation $H \cdot G^T = 0$, where $G^T$ is the transpose of the matrix G.

If $y=(y_1, \ldots, y_N)^T$ is noted, the observable representing the word to be decoded (obtained for example by demodulating the received signal or read from a recording medium), the decoding in the sense of the maximum likelihood (ML decoding) is equivalent to the search for the code word $x=(x_1, \ldots, x_N)^T$ having the maximum correlation with the vector y.

The GDBF decoding method defines, to do this, an objective function, E(x), also referred to as an energy function, by:

$$E(x) \triangleq \alpha \sum_{n=1}^{N} x_n y_n + \sum_{m=1}^{M} \prod_{n \in H(m)} x_n \quad (1)$$

The first term of the objective function is none other than the correlation (weighted by the coefficient α>0) between the vector x and the signal received, the second term representing the sum of the syndromes of x. This second term is maximum and equal to M when x is a code word. The multiplying coefficient α controls the contribution of the correlation term to the objective function. If the vector x* that maximises the objective function is a code word, this is necessarily the solution of the decoding in the sense of the maximum likelihood.

The approach proposed in the aforementioned article by T. Wadayama consists of maximising the objective function E(x) (or, in an equivalent fashion, minimising the cost function −E(x) using a variant of the gradient descent algorithm). More precisely, an iterative algorithm is used that minimises the cost function in successive directions. To do this, a local energy function $E_n(x)$ is introduced, defined by:

$$E_n(x) \square \alpha x_n y_n + \sum_{m \in H(n)} \prod_{n' \in H(m)} x_{n'} \quad (2)$$

The first term relates to the correlation along the x axis $x_n$, the second term is a sum of syndromes relating to all the variable nodes, connected to the variable node $x_n$ by a parity equation.

For reasons of simplification, the local energy function $E_n(x)$ in the direction x will hereinafter be denoted $E_n$. At each decoding iteration, a set F of the unreliable bits is defined. These bits are those the local energy of which is lower than a predetermined threshold, $E_{th}$. In other words, the bits weakly correlated with the received signal and corresponding to a high probability of error are selected as having to be flipped. More precisely:

$$F \square \{x_v | E_v \leq E_{th}\} \quad (3)$$

When the channel is a binary symmetric channel (BSC), it has been proposed to take as a threshold value:

$$E_{th} = \min_{n=1,\ldots,N}(E_N) \quad (4)$$

In other words, the set F then consists, at each iteration, of the bits minimising the local energy function.

Alternatively, it has been proposed to use a fixed or adaptive threshold value, then dependent on the index of the iteration.

FIG. 1 shows schematically the flow diagram of a GDBF decoding method for decoding an LDPC code.

The main steps of the decoding method have been summarised therein.

At the step 110, a first estimation is made of the code word x from an observable y representing the word to be decoded. For example, if the vector y has as its elements log likelihood ratios (LLRs), $$y_n = \log \frac{Pr(x_n = +1 | r)}{Pr(x_n = -1 | r)}, n = 1, \ldots, N$$

it will be possible to simply estimate the elements of x by $x_n = \mathrm{sgn}(y_n)$ where n=1, ..., N and $\mathrm{sgn}(y_n)$ is the sign of $y_n$ ($\mathrm{sgn}(y_n)$=+1 if $y_n$>0 and $\mathrm{sgn}(y_n)$=1 if $y_n$<0).

Next an iterative decoding loop is entered.

First of all at 120 a calculation is made of the syndrome of x, in other words of $$\prod_{n \in H(m)} x_n, m = 1, \ldots, M.$$

It is checked at 130 whether the syndrome is zero, in other words here whether each of the parity equations is satisfied:

$$\prod_{n \in H(m)} x_n = +1, \forall m \in \{1, \ldots, M\}.$$

If so, the decoding algorithm stops by supplying the code word x at 135.

If not, it is determined at 140 whether the maximum number of iterations has been reached. If such is the case, the algorithm stops at 145 by providing an error indication.

On the other hand, if the maximum number of iterations is not reached, the local energy values $E_n$, n=1, ..., N are calculated at 150.

The set F of bits to be flipped is deduced therefrom at the step 160. To do this, the bits the local energy values of which are lower than a threshold value $E_{th}$ are determined, as explained above.

At the step 170, the bits of the set F are flipped, in other words $x_v = -x_v$, $\forall x_v \in F$ and then a new iteration is implemented by returning to the step 120.

As indicated previously, the drawback of the GDBF decoding method lies in the presence of a large number of local extrema (local minima of the cost function or local maxima of the energy function). The behaviour of the decoder being purely deterministic, it may then run through indefinitely (in the absence of any stop criterion relating to the number of iterations) a sequence of local extrema or even remain locked on one of them.

The PGDBF and NGDBF methods remedy this difficulty by introducing a randomisation mechanism in the determination of the bits to be flipped.

The PGDBF method was described in the article by O. Al Rasheed et al. entitled "Fault-tolerant probabilistic gradient-descent bit flipping decoder", published in IEEE Comm. Letters, vol. 18, no. 9, pp. 1487-1490, 2014.

It consists, as in the GDPF method, in determining, at each iteration, the set F of bits the local energy of which is below a predetermined threshold value and then flipping each of the bits of F with a probability 0<p<1, p being a parameter of the algorithm.

The NGDBF method was described in the article by G. Sundararajan et al. entitled "Noisy gradient descent bit-flip decoding for LDPC codes", published in IEEE Trans. on Comm., vol. 62, no. 10, pp. 3385-3400, 2014.

In this method, the randomisation is introduced in the determination of the set F itself, this then being defined by:

$$F = \{x_v | E_v + Z_v \leq E_{th}\} \quad (5)$$

where $Z_v \square N(0, \sigma^2)$ is a centred Gaussian random variable of variance $\sigma^2$, $\sigma^2$ being a parameter of the algorithm.

As in the GDBF method, all the bits of F are then flipped.

If the PGDBF and NGDBF decoding methods have better error correction performance than the GDBF decoding method because of their ability to depart from the local extrema, they do however not equal the performance of the decoding methods of the message passing type (BP or Min-Sum for example).

The aim of the present invention is consequently to propose a decoding method of the GDBF type, randomised or not, that makes it possible to decode an LDPC code with error correction performance close to that of message-passing decoding messages or even better than these, without being substantially more complex than the GDBF decoding methods.

DESCRIPTION OF THE INVENTION

The present invention is defined by a method for decoding an LDPC code represented by a Tanner graph comprising N variable nodes and M control nodes, each control node being associated with a parity constraint relating to a plurality of variable nodes, said decoding method operating on an observable (y) representing the word to be decoded and proceeding by successive iterations, each iteration operating on an estimated word (x) and, if the estimated word is not a code word, determining a set ($\tilde{F}$) of the least reliable bits of this word in order to be flipped before the following iteration, the least reliable bits of the estimated word being determined as those where the value of a local energy function ($\tilde{E}_n$) is less than a threshold value, the local energy function of a bit comprising a first component proportional to the correlation between this bit and a corresponding element of the observable, a second component representing the number of non-satisfied constraints in which said bit is involved, said method being original in that the local energy function further comprises a third component, referred to as an inertial component, decreasing with the number ($\ell_n$) of iterations performed since the last flipping of this bit.

According to a first embodiment, each bit in the set ($\tilde{F}$) of the least reliable bits is flipped before the following iteration.

According to a second embodiment, each bit in the set ($\tilde{F}$) of the least reliable bits is flipped with a predetermined probability p, 0<p<1, before the following iteration.

According to a third embodiment, to determine the set ($\tilde{F}$) of the least reliable bits, a random noise of predetermined variants ($\sigma^2$) is added to the value of the local energy function ($\tilde{E}_n$) before comparison with said threshold value.

Advantageously, the threshold value is determined from the minimum value of the local energy function on the bits of the estimated word, increased by a predetermined margin $\delta \geq 0$.

Said threshold value may be adaptive and be a function of the total number of iterations performed since the start of decoding.

Preferably, the inertial component of the local energy function of a bit is a decreasing linear function of the number of iterations performed since the last flipping of this bit.

Alternatively, the inertial component of the local energy function of a bit is a linear function defined piecewise.

Preferably the local energy function of a bit is zero beyond a predetermined value L.

In the latter case, in an initialisation step, the number $\ell_n$ representing the number of iterations performed since the last flipping of a bit can be initialised to a value $\ell_{max} \geq L$, this number being set to zero as soon as this bit is flipped, and incremented at each iteration until it reaches said value L.

BRIEF DESCRIPTION OF THE DRAWINGS

Other features and advantages of the invention will emerge from reading a preferential embodiment of the invention described with reference to the accompanying figures, among which.

DETAILED DESCRIPTION OF PARTICULAR EMBODIMENTS

Figure 1:
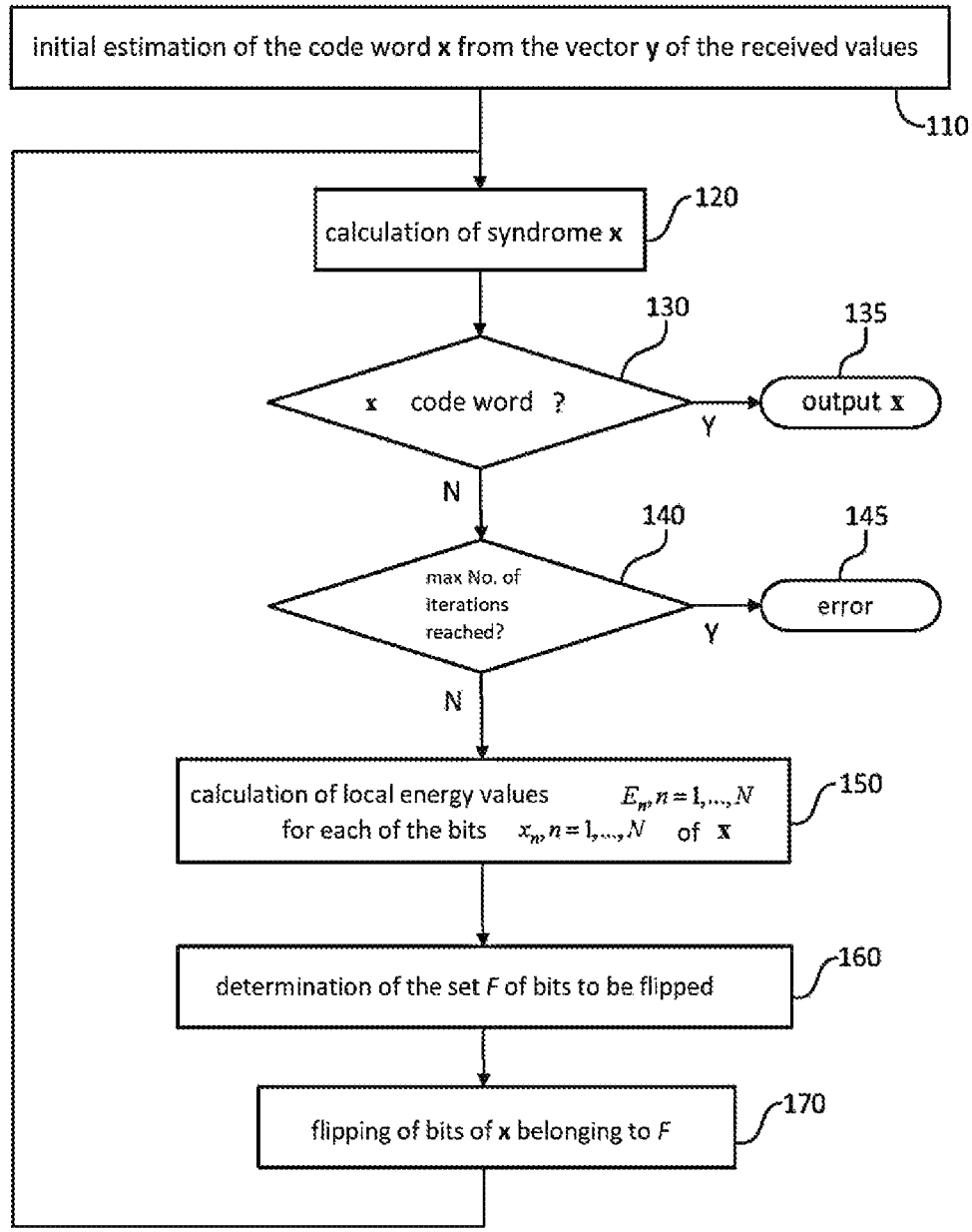
FIG. 1 shows schematically a flow diagram of a GDBF decoding method for decoding an LDPC code, known from the prior art.

We shall consider hereinafter a method for GDBF decoding of an LDPC code, in the form of a randomised variant such as PGDBF or NGDBF, as described in the introductory part.

The idea at the basis of the invention is to add an inertial component to the local energy function. The purpose of this component is to reduce the probability of a bit being flipped if it has already recently been flipped during a previous iteration. In other words, an inertia effect is introduced obliging the iterative decoding algorithm to seek the maximum of the energy function while keeping a certain directional coherence. This component makes it possible to avoid oscillations between positions corresponding to local extrema.

More precisely, the new energy function can be expressed in the form, keeping the previous notations:

$$\tilde{E}_n(x) \Box \alpha x_n y_n + \sum_{m \in H(n)} \prod_{n' \in H(m)} x_{n'} + \rho(\ell_n) \quad (6)$$

where $\ell_n \geq 1$ is defined as the number of iterations since the last flipping of the bit $x_n$ and $\rho(\ell_n)$ is the inertial component that is associated with $1_n$. Thus, $1_n=1$ if the bit $x_n$ was flipped at the last iteration, $\ell_n=2$ if it was flipped at the last iteration but one, etc. Hereinafter, the local energy function in the direction of $x_n$ will more simply be noted $\tilde{E}_n$.

It is supposed that the aforementioned inertial component has a memory effect limited to a predetermined number L of iterations. It can consequently be represented in the form of a vector p of size L, i.e. $\rho=(\rho(1), \rho(2), \ldots, \rho(L))$, with $\rho(1) \geq \rho(2) \geq \ldots \geq \rho(L) > 0$, on the understanding that $\rho(\ell_n)=0$ for $1_n>L$.

At the start of the decoding, the number $\ell_n$ of iterations since the last iteration of the bit, $x_n$, is initialised to L+1, this for n=1, ..., N. If the bit $x_n$ is flipped during an iteration, the corresponding number $\ell_n$ is set to zero. It is systematically incremented by 1 at the start of each iteration without however being able to exceed the maximum value, L+1. In other words, if the bit $x_n$ was flipped at the previous iteration, the value $\ell_n=1$ is taken into account at the current iteration for calculating the local energy function.

According to a first embodiment of the invention, at the end of each iterative decoding iteration, a set $\tilde{F} \Box \{x_v | \tilde{E}_v \leq \tilde{E}_{th}\}$ of unreliable bits is determined where $\tilde{E}_{th}$ is a fixed or adaptive threshold value, determined as specified below. The bits of F are next flipped in preparation for the following iteration.

According to a second embodiment of the invention, corresponding to the PGDBF variant, each bit of $\tilde{F}$ is flipped randomly, with a probability $0<p<1$ where p is a parameter of the algorithm. In other words, for each bit belonging to $\tilde{F}$, a random variable u is drawn, for example equally distributed over the interval [0,1], the bit in question being flipped if $u<p$ and being kept unchanged otherwise.

According to a third embodiment of the invention, corresponding to the NGDBF variant, the set $\tilde{F}$ of the unreliable bits are randomised, i.e. $\tilde{F}\square\{x_v|\tilde{E}_v+Z_v\leq\tilde{E}_{th}\}$ where $Z_v\square N(0,\sigma^2)$ is a centred Gaussian random variable of variance $\sigma^2$, $\sigma^2$ being a parameter of the algorithm. In other words, to each energy value of a bit a random noise sample is added, for example a centred Gaussian noise of variance $\sigma^2$, the energy value to which noise is thus added being compared with said threshold value. In an equivalent fashion, the energy value of each bit is compared with the sample of a Gaussian random variable centred on $\tilde{E}_{th}$ and of variance $\sigma^2$, a sample being drawn at each bit. Typically $\sigma\square\tilde{E}_{th}$ will be selected.

Figure 2:
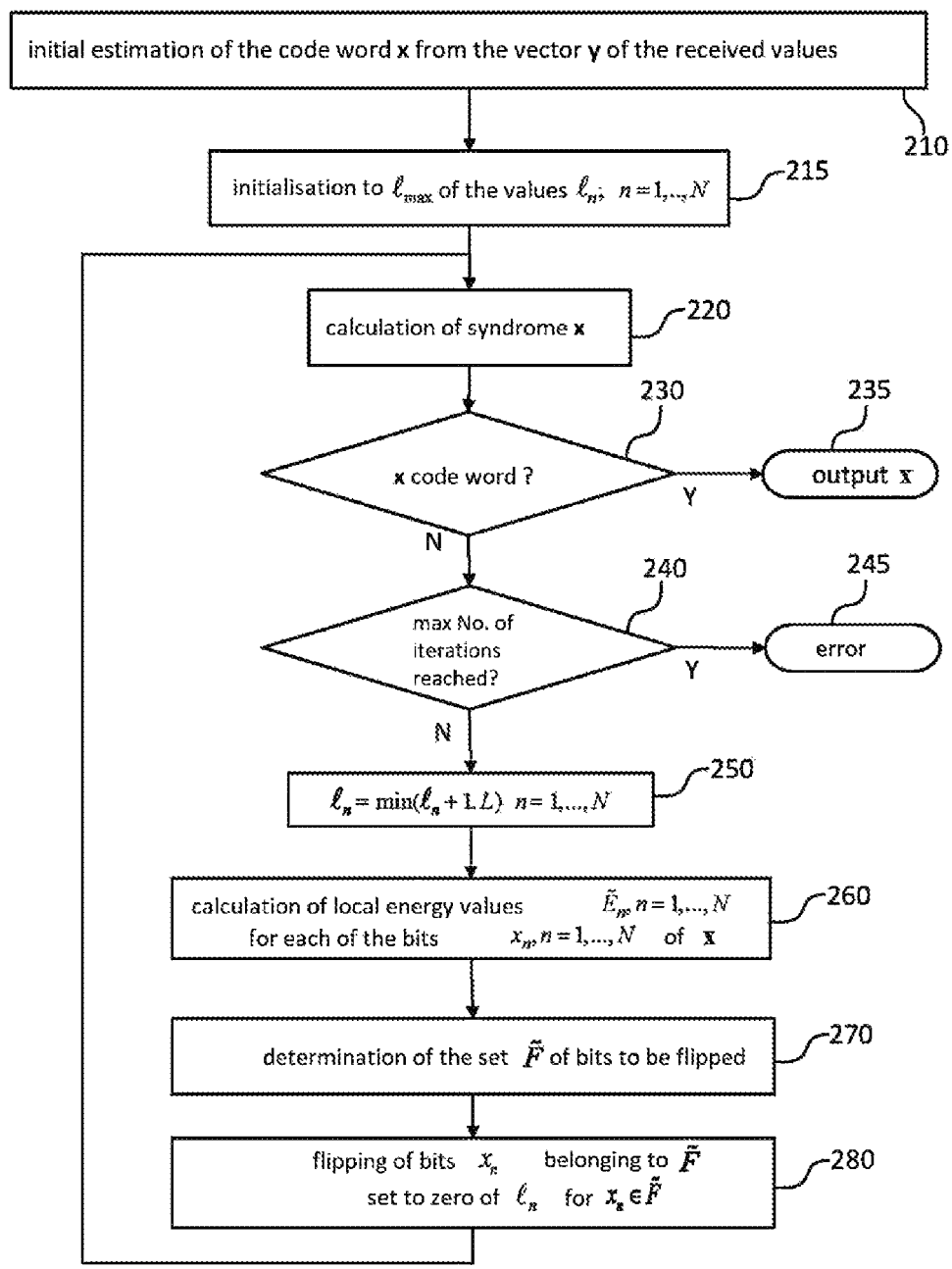
FIG. 2 shows schematically a flow diagram of a method for decoding an LDPC code according to one embodiment of the present invention.

FIG. 2 shows schematically a flow diagram of a method for decoding an LDPC code according a first embodiment of the present invention.

At the step 210, an initial estimation is made of the code mode x from an observable y representing the word to be decoded as at step 110. As before, the vector y can consist of values of LLRs and the binary word x consists of corresponding sign values.

At step 215, the number $\ell_n$ of iterations since the last flipping is also initialised, for each of the bits $x_n$, $n=1, \ldots, N$. More precisely, $\ell_n=L+1$, $n=1, \ldots, N$.

An iterative loop is next entered, wherein:

The syndrome of x is calculated at 220, i.e. $c_m$, $m=1, \ldots, M$.

At 230, it is checked from the syndrome whether x is a code word, that is to say whether $c_m=+1$, $\forall m\in\{1, \ldots, M\}$ or, in an equivalent fashion, whether $$\sum_{m=1}^{M} c_m = M.$$

If such is the case, the decoding algorithm supplies the code word x at 235.

On the other hand, if the word is erroneous, it is determined at 240 whether the maximum number of iterations is reached.

If so, an error indication is generated at 245.

If not, the step 250 continues by incrementing the values $\ell_n$ of 1 without however exceeding the value L. In other words, $\ell_n=\min(\ell_n+1,L)$.

At the step 260, local energy values are calculated, $\tilde{E}_n$, $n=1, \ldots, N$, from expression (6).

The set $\tilde{F}$ of the least reliable bits are next determined at step 270. The set $\tilde{F}$ consists of bits the local energy values of which are lower than a threshold value $\tilde{E}_{th}$, calculated for example as $$\tilde{E}_{th} = \min_{n=1,\ldots,N}(E_n) + \delta,$$

where $\delta\geq 0$ is a predetermined margin.

At the step 280, the bits of x belonging to the set $\tilde{F}$ are flipped and step 220 is returned to for a new iteration.

A person skilled in the art will understand that the second embodiment differs from the first in that, at the step 270, the bits of the set $\tilde{F}$ are not systematically flipped but are flipped only with a predetermined probability p as indicated above.

In a similar fashion, the third embodiment differs from the first in that, at the step 260, in order to determine whether a bit belongs to the set $\tilde{F}$, a random noise sample is added to the local energy of the bit, for example a Gaussian random noise of variance $\sigma^2$, before comparing it with the threshold value, $\tilde{E}_{th}$.

The elements of the vector representing the inertial component, $\rho=(\rho(1), \rho(2) \ldots, \rho(L))$, can be determined in various ways.

First of all, the elements of the vector $\rho$ can be determined by simulation of the Monte-Carlo type so as to optimise the error correcting performance of the decoding method.

Alternatively, they can be obtained by a reinforcement learning method wherein each state corresponds to a vector $\rho$ (the elements $\rho(1), \rho(2), \ldots, \rho(L)$ are assumed to be discretised), a reward being allocated when the decoding supplies a code word, the reward being able to be proportional to the difference $P_{max}-P$ where $P_{max}$ is the maximum number of iterations in the stop criterion and P is the number of iterations performed in order to obtain the code word.

Alternatively again, it will be possible to proceed with an exhaustive search in a restricted space.

More precisely, if it is noted that $\tilde{E}_n=E_n+\rho(\ell_n)$ and if it is assumed that the elements of the vector y are discretised, that is to say take their values in the set $\{-Q_p, \ldots, -Q_1, 0, Q_1, \ldots, Q_p\}$, the value of the local energy function $E_n$ associated with the variable $x_n$ is bounded by:

$$-(\alpha Q_p+d_v)\leq E_n\leq\alpha Q_p+d_v \tag{7}$$

where $d_v$ is the maximum degree of a variable node in the Tanner graph.

If it is supposed now that at least one parity equation associated with a control node is unsatisfied (failing that all the parity equations would be satisfied and the word would be a code word), there is at least one variable node $x_n$ for which:

$$E_n\leq\alpha Q_p+(d_v-2) \tag{8}$$

insofar as an error on $x_n$ results in a difference of 2 in a value of $c_m$, $m\in H(n)$.

The result is that the minimum energy value $$E_{min} = \min_{n=1,\ldots,N}(E_n)$$

also satisfies:

$$E_{min}\leq\alpha Q_p+(d_v-2) \tag{9}$$

Since the purpose of the inertial component is to increase the energy of the bits that have recently been flipped, it can be supposed that the minimum $E_{min}$ is reached for a bit that has not been flipped during the last L iterations, that is to say the inertial component of which is zero $\rho(\ell_n)=0$.

As a result, the threshold value $\tilde{E}_{th}$ satisfies:

$$\tilde{E}_{th}\leq\alpha Q_p+(d_v-2)+\delta \tag{10}$$

If now $\rho_{max}=2\alpha Q_p+(2d_v-2)+\delta+\varepsilon$, is defined, it will be understood that, as soon as a variable node $x_n$ has a local energy value $E_n$ with an inertial component $\rho(\ell_n)\geq\rho_{max}$:

$$\tilde{E}_n=E_n+\rho(\ell_n)\geq\alpha Q_p+(d_v-2)+\delta+\varepsilon>\tilde{E}_{th} \tag{11}$$

and therefore that $x_n$ will not be flipped during the current iteration.

It can therefore be concluded from this that $\rho(\ell) \leq \rho_{max}$, $\ell = 1, \ldots, L$ insofar as a value higher than $\rho_{max}$ would prevent any flipping of a bit as soon as the number of iterations since the last flipping thereof would be equal to $\ell$.

This property makes it possible to restrict the search for possible values of $\rho(1), \rho(2), \ldots, \rho(L)$ to a restricted zone of $(\square^+)^N$, namely the one defined by:

$$\rho_{max} \geq \rho(1) \geq \rho(2) \geq \ldots \geq \rho(L) > 0 \tag{12}$$

Thus, it will be possible initially to fix a value of L and then make a search by brute force among the L-tuplets $\rho(1), \rho(2), \ldots, \rho(L)$ of discretised values satisfying (12) and leading to the smallest error rate. Alternatively, it will be possible to use a genetic algorithm with operations of mutation, combination and selection of the vectors $\rho$ in order to seek the one corresponding to the lowest error rate.

In all cases this optimisation of the elements of $\rho$ can be done once and for all offline.

According to another approach, it will be possible to express the inertial component $\rho(\ell)$ as a linear or polynomial function of the number f of iterations since the last flipping. For example, in the linear case the inertial component will have the following form:

$$\rho(\ell) = -a\ell + b, \ell = 1, \ldots, L \tag{13}$$

with a,b>0. The maximum value, $\rho_{max}$, of the inertial component will then be selected so that:

$$\rho_{max} \geq \rho(1) = -a + b \tag{14-1}$$

and the minimum value of this component must be positive, i.e.:

$$\rho(L) = -aL + b > 0 \tag{14-2}$$

Finally, optimisation of the elements of $\rho$ will be reduced to the search for the parameters a,b.

A person skilled in the art will be able to envisage other parametric expressions of $\rho(\ell)$ without departing from the scope of the present invention. Thus $\rho(\ell)$ will be able to be sought as a decreasing polynomial expression on [1,L].

For high values of L, it will also be possible to define the function $\rho(\ell)$ piecewise, for example as a linear or even constant function by pieces, in which case:

$$\rho(1) = \ldots = \rho(\ell_1) > \rho(\ell_1+1) = \ldots = \rho(\ell_2) > \ldots >$$
$$\rho(\ell_s+1) = \ldots = \rho(L) > 0 \tag{15}$$

with $1 < \ell_1 < \ell_2 \ldots < \ell_s < L$ defining the bounds of the intervals in question.

The differences in performance between the method for decoding LDPC code according to the present invention and the methods known from the prior art are illustrated by means of FIGS. 3A-3B and 4A-4B.

The first LDPC code was a regular code (4,8), of rate R=0.5, of length N=1296 bits. It will be recalled that a code is regular when all the variable nodes have the same degree, $d_v$, and all the control nodes also have the same degree, $d_c$, in the Tanner graph. The degrees of the variable nodes and of the control nodes were respectively $d_v=4$ and $d_c=8$.

The second LDPC code was a regular code (6,32), of rate R=0.84, of length N=2048 bits. The degrees of the variable nodes and of the control nodes were respectively $d_v=6$ and $d_c=32$. This code comes from IEEE 802.3an (Ethernet 10 Gbits/s on twisted pair).

The decoding methods known from the prior art have been shown in the figures by their acronyms, namely:

BP, floating point: decoding by belief propagation, floating-point calculation;

MS, quant (4,6): decoding by means of the Min-Sum algorithm with 4-bit messages;

MS, floating point: decoding by means of the Min-Sum algorithm, floating-point calculation;

BF: original method by bit flipping (Gallagher);

GDBF: gradient descent bit flipping decoding method;

PGDBF: probabilistic gradient descent bit flipping method.

The examples of decoding methods according to the present invention are represented by:

GDBF-w/M: GDBF with inertial component (with momentum)

PGDBF-w/M: PGDBF with inertial component (with momentum)

Figure 3A:
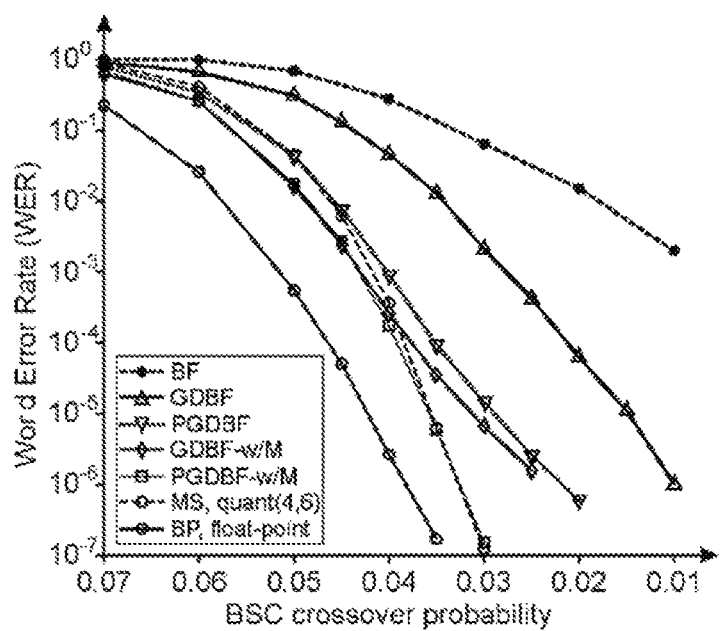
FIGS. 3A and 3B illustrate the performances of decoding methods of the GDBF type known from the prior art and of a decoding method according to an embodiment of the present invention, in the case of a binary symmetric channel, respectively for a first and for a second example of an LDPC code.
Figure 3B:
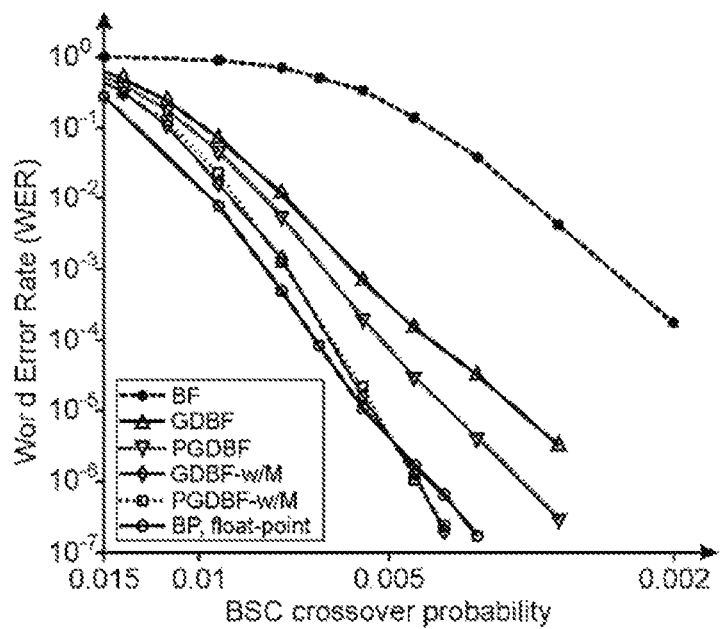

In the case of FIGS. 3A and 3B, it has been supposed that the channel was binary symmetric and the word error rate or WER has been shown as a function of the probability of switching of a bit onto the channel (BSC crossover probability).

The correlation coefficient (GDBF/PGDBF methods with or without inertia) was selected so that $\alpha=1.0$ for the first LDPC code and $\alpha=2.0$ for the second LDPC code.

The margin $\delta$ in the threshold value $\tilde{E}_{th}$ (GDBF/PGDBF methods with or without inertia) was selected as zero whether for the first or the second LDPC code.

The probability of flipping p in the PGDBF and PGDBF-w/M methods was selected so that p=0.9 for decoding the first LDPC code and p=0.8 for decoding the second LDPC code.

For decoding the first LDPC code with the GDBF-w/M and PGDBF-w/M methods, the inertial component was the dimension L=3 with $\rho=[4\ 2\ 1]$.

For decoding the second LDPC code with the GDBF-w/M and PGDBF-w/M methods, the inertial component was the dimension L=4 with $\rho=[4\ 3\ 2\ 1]$.

It will be noted that introducing an inertial component substantially improves the GDBF and PGDBF decodings. Furthermore, the GDBF-w/M decoding has better performance than the PGDBF decoding, even though the first does not use randomisation for flipping. Furthermore, the PGDBF-w/M decoding of the first or second code does not show any error floor as far as WER levels of around $10^{-7}$. Finally, decoding the second LDPC code by the GDBF-w/M method or by the PGDBF-w/M method have equivalent performances, these performances being of the same order as, or even better than, those of the belief propagation BP method in the region of the error floor.

Figure 4A:
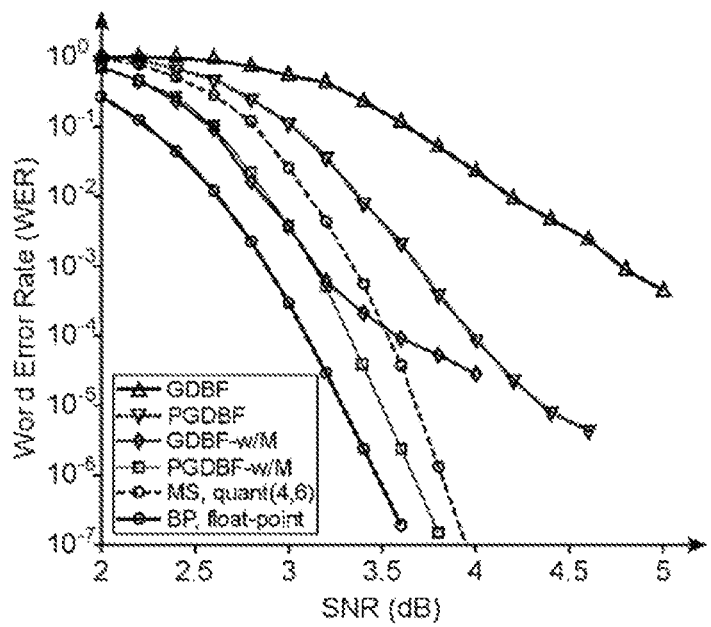
FIGS. 4A and 4B illustrate the performances of decoding methods of the GDBF type known from the prior art and of a decoding method according to an embodiment of the present invention in the case of an AWGN channel, respectively for a first and for a second example of an LDPC code.
Figure 4B:
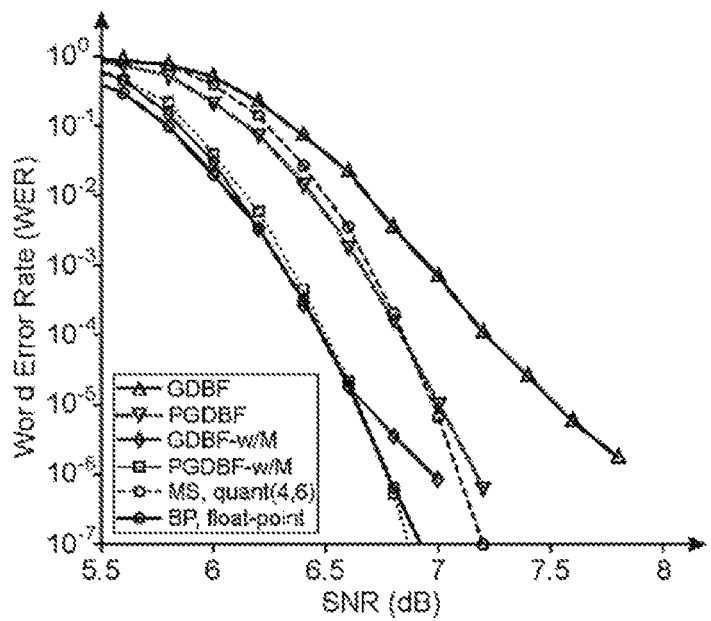

In the case of FIGS. 4A and 4B, it has been supposed that the channel was of the AWGN type (in other words affected by Gaussian additive white noise) and the word error rate (WER) has been shown.

The correlation coefficient (GDBF/PGDBF methods with or without inertia) was selected so that $\alpha=1.8$ for the first LDPC code and $\alpha=4.5$ for the second LDPC code.

The margin $\delta$ in the threshold value $\tilde{E}_{th}$ (GDBF/PGDBF methods with or without inertia) was selected equal to 1.1 for the first LDPC code and 1.2 for the second LDPC code.

The flipping probability p in the PGDBF and PGDBF-w/M methods was selected so that p=0.9 for decoding the first LDPC code and p=0.8 for decoding the second LDPC code.

For decoding the first LDPC code with the GDBF-w/M and PGDBF-w/M methods, the inertial component was the dimension L=7 with $\rho=[2\ 2\ 2\ 2\ 2\ 1\ 1]$.

For decoding the second LDPC code with the GDBF-w/M and PGDBF-w/M methods, the inertial component was the dimension L=4 with $\rho=[3\ 3\ 2\ 1]$.

It will be noted that the GDBF-w/M and PGDBF-w/M decodings have substantially the same performances in the waterfall region and even exceed those of the floating-point MS decoding even if the GDBF-w/M decoding has lower performance than PGDBF-w/M in the floor region. The performance of the PGDBF-w/M decoding approaches (first LDPC code) or even attains (second LDPC code) those of the belief propagation decoding with floating-point calculation (floating-point BP).

In general, the GDBF or PGDBF decoding methods with inertial component make it possible to obtain performances (in terms of WER as a function of the signal to noise ratio) comparable to those of a belief-propagation (BP) decoding method or even better in the error floor region. The decoding methods according to the invention are therefore particularly advantageous in the cases where the error floor is very low, that is to say when the Tanner graph has a high degree of connectivity $d_c$.

The invention claimed is:

1. A method for decoding, in a communication system, a received LDPC code represented by a Tanner graph comprising N variable nodes and M control nodes, each control node being associated with a parity constraint relating to a plurality of variable nodes, the method comprising:
   performing, by processing circuitry, successive iterations, each iteration including
      determining an estimated word from an observable representing a word to be decoded;
      when determining that the estimated word is not a code word, determining a set of least reliable bits of the estimated word to be flipped before a following iteration, the least reliable bits of the estimated word being determined as those where a value of a local energy function of a bit is less than a threshold value, the local energy function of the bit comprising a first term proportional to a correlation between the bit and a corresponding element of the observable, a second term representing a number of non-satisfied constraints in which the bit is involved, and an inertial term that decreases with a number of iterations performed since a last flipping of the bit, and flipping bits in the estimated word based on the determined least reliable bits: and
      when determining that the estimated word is a code word, outputting the estimated code word as a decoded LDPC code word.

2. The method for decoding an LDPC code according to claim 1, further comprising flipping each bit in the set of least reliable bits before the following iteration.

3. The method for decoding an LDPC code according to claim 1, further comprising flipping each bit in the set of least reliable bits with a predetermined probability p, 0<p<1, before the following iteration.

4. The method for decoding an LDPC code according to claim 1, wherein, the step of determining the set of least reliable bits comprises adding a random noise of predetermined variance to the value of the local energy function before comparison with said threshold value.

5. The method for decoding an LDPC code according to claim 1, further comprising determining the threshold value from the minimum value of the local energy function on the bits of the estimated word, increased by a predetermined margin $\delta \geq 0$.

6. The method for decoding an LDPC code according to claim 1, wherein the threshold value is adaptive and is a function of a total number of iterations implemented since a start of decoding.

7. The method for decoding an LDPC code according to claim 1, wherein the inertial term of the local energy function of the bit is a decreasing linear function of the number of iterations implemented since the last flipping of the bit.

8. The method for decoding an LDPC code according to claim 1, wherein the inertial term of the local energy function of the bit is a linear function defined piecewise.

9. The method for decoding an LDPC code according to claim 1, wherein the local energy function of the bit is zero beyond a predetermined number L of iterations.

10. The method for decoding an LDPC code according to claim 9, further comprising initializing the number of iterations implemented since the last flipping of the bit to a value $I_{max} \geq L$, the number being set to zero as soon as said bit is flipped, and incremented at each iteration until said value L is reached.

* * * * *